(12) United States Patent
Saha et al.

(10) Patent No.: US 10,917,058 B2
(45) Date of Patent: Feb. 9, 2021

(54) SERVO-AMPLIFIER WITH CLOSED-LOOP BIASING

(71) Applicant: TEXAS INSTRUMENTS INCORPORATED, Dallas, TX (US)

(72) Inventors: Aalok Dyuti Saha, Cooch Behar (IN); Bhaskar Ramachandran, Coimbatore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 16/185,591

(22) Filed: Nov. 9, 2018

(65) Prior Publication Data

US 2020/0014347 A1 Jan. 9, 2020

(30) Foreign Application Priority Data

Jul. 6, 2018 (IN) .............................. 201841025269

(51) Int. Cl.
*H03F 1/22* (2006.01)
*H03F 3/45* (2006.01)

(52) U.S. Cl.
CPC ........... *H03F 3/45094* (2013.01); *H03F 1/22* (2013.01); *H03F 2203/45024* (2013.01)

(58) Field of Classification Search
CPC . H03F 1/22; H03F 1/223; H03F 1/226; H03F 1/52; H03F 1/523; H03F 3/45
USPC .................. 330/298, 300, 311, 252, 257
See application file for complete search history.

(56) References Cited

U.S. PATENT DOCUMENTS

| | | | |
|---|---|---|---|
| 4,206,418 A * | 6/1980 | Dingwall | ............ H03F 3/45183 330/253 |
| 5,748,040 A | 5/1998 | Leung | |
| 5,760,647 A * | 6/1998 | Miller | ................. H03F 3/45089 330/252 |
| 5,789,981 A | 8/1998 | Singer et al. | |
| 6,218,900 B1 * | 4/2001 | Nolan | ....................... H03F 1/52 327/52 |

(Continued)

OTHER PUBLICATIONS

K. Bult and G.J.G.M. Geelen, "A Fast-Settling CMOS Op Amp for SC Circuits with 90-dB DC Gain," in IEEE Journal of Solid-State Circuits, vol. 25, No. 6, pp. 1379-1384, Dec. 1990.

(Continued)

*Primary Examiner* — Steven J Mottola
(74) *Attorney, Agent, or Firm* — Mark Allen Valetti; Charles A. Brill; Frank D. Cimino

(57) ABSTRACT

A servo-amplifier includes a first bipolar transistor, a second bipolar transistor, a cascode transistor, and a bias transistor. The second bipolar transistor includes an emitter terminal that is connected to an emitter terminal of the first bipolar transistor to form a differential amplifier. The cascode transistor includes a source terminal that is connected to a collector terminal of the first bipolar transistor. The bias transistor is coupled to the first bipolar transistor, the second bipolar transistor and the cascode transistor. The bias transistor is configured to generate a bias voltage to drive a gate terminal of the cascode transistor based on a voltage at a base terminal of the first bipolar transistor and a voltage at a base terminal of the second bipolar transistor. As a result, neither of the bipolar transistors enters a saturation region during transient or steady state operation.

18 Claims, 5 Drawing Sheets

(56) References Cited

U.S. PATENT DOCUMENTS 10,476,457 B2 * 11/2019 Schober .............. H03F 3/45183

OTHER PUBLICATIONS

Texas Instruments, "TPS2595xx 2.7 V to 18 V, 4-A, 34-mΩ eFuse With Fast Overvoltage Protection," TPS2595 datasheet, Jan. 2017 [Revised Apr. 2018].

* cited by examiner

SERVO-AMPLIFIER WITH CLOSED-LOOP BIASING

CROSS-REFERENCE TO RELATED APPLICATIONS

The present application claims priority to India Provisional Patent Application No. 201841025269, filed Jul. 6, 2018, entitled "Closed Loop Biasing Scheme for Low Offset Amplifier to Prevent BJT Saturation and Unwanted Operating Point During Output Hotplug/Transient," which is hereby incorporated herein by reference in its entirety.

BACKGROUND

A circuit protection device, such as a fuse or circuit breaker, protects an electrical circuit from damage due to over-current or short-circuit conditions. An over-current condition occurs when the electrical current flowing in a circuit (e.g., due to the demands of a load) exceed the design rating of the circuit. A short-circuit condition occurs when electrically conductive elements of a circuit make contact causing electrical current to bypass the circuit's electrical load, which can result in very high electrical currents. Over-current and short-circuit conditions can damage conductors and other components of an electrical circuits due to overheating of the conductor wires and result in burning of the wire insulation. A circuit protection device detects the occurrence of an over-current or short-circuit condition, and opens an electrical switch or otherwise decreases current flow to the protected electrical circuit to prevent circuit damage.

Fuses, positive temperature coefficient resistors, and active circuit protection are a few available the circuit protection devices. Fuses are typically used to isolate overload or short-circuit faults from the main system. However, fault current generally needs to be much higher than the rating of the fuse, and response time ranges from milliseconds to seconds making it difficult to predict the precise overcurrent level at which the fuse will open. Once the fuse opens it must be physically replaced, which increases system down time and maintenance costs. Positive temperature coefficient resistors provide resettable overcurrent protection and, unlike a fuse, do not require replacement. The reaction time of positive temperature coefficient resistors in is in the range of several milliseconds, and the resistance increases with each activation.

Active circuit protection devices measure the current flowing through a field effect transistor (FET), and control the resistance of the FET to limit current flowing to the load when a fault condition is detected. Active current protection devices can respond more quickly and provide more accurate fault detection than passive solutions.

SUMMARY

A servo-amplifier with closed loop biasing and circuit protection device that includes an implementation of the servo-amplifier are disclosed herein. In one example, an electronic fuse circuit includes a power transistor, a sense transistor, and a servo-amplifier. The power transistor is configured to conduct current to a load circuit. The sense transistor coupled to the power transistor. The sense transistor is configured to conduct a current that is a predetermined fraction of the current conducted by the power transistor. The servo-amplifier is coupled to the power transistor and the sense transistor. The servo-amplifier includes a bipolar transistor and a bias transistor. The bipolar transistor includes a first terminal that is coupled to the sense transistor. The bias transistor includes a first terminal that is coupled to the power transistor, and a second terminal that is coupled to the first terminal of the bipolar transistor.

In another example, a servo-amplifier includes differential amplifier. The differential amplifier includes a first transistor and a second transistor. The second transistor includes a first terminal connected to first terminal of the first transistor. The servo-amplifier also includes a third transistor. The third transistor includes a first terminal and a second terminal. The first terminal is coupled to a second terminal of the second transistor. The second terminal of the third transistor is connected to a second terminal of the first transistor.

In a further example, a servo-amplifier includes a first bipolar transistor, a second bipolar transistor, a cascode transistor, and a bias transistor. The second bipolar transistor includes an emitter terminal that is connected to an emitter terminal of the first bipolar transistor to form a differential amplifier. The cascode transistor includes a source terminal that is connected to a collector terminal of the first bipolar transistor. The bias transistor is coupled to the first bipolar transistor, the second bipolar transistor and the cascode transistor. The bias transistor is configured to generate a bias voltage to drive a gate terminal of the cascode transistor based on a voltage at a base terminal of the first bipolar transistor and a voltage at a base terminal of the second bipolar transistor.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

Power management circuits (e.g., electronic fuse circuits, overcurrent protection circuits, etc.) include a power field effect transistor (FET) that conducts current to a load circuit and a much smaller sense FET that is used to measure the current flowing in the power FET. A high-voltage servo-amplifier is disposed in a servo-loop and coupled to the outputs of the power FET and the sense FET. The servo-loop is a feedback loop that controls the current flowing in the sense transistor based on the output voltages of the power FET and the sense FET. Such control maintains the current through the sense FET as a desired fraction of the current through the power FET, thereby allowing accurate measurement of the current through the power FET. The output of the servo-amplifier equalizes the gate-source voltage and also the drain-source voltage of the power FET and the sense FET. In implementations of the servo-amplifier that use constant voltage biasing, a large transient current from the output of the power FET to the output of the sense FET, as may occur when a circuit including the power management circuit is hot-plugged, hot-swapped, or subject to a fast output rise time, which may cause the servo-amplifier to settle into a stable but inoperative state. Hot-plugging and hot-swapping refer to the installation of a component in a system while the system is operating (i.e., without removing power from or turning off the system). Under such conditions, the servo-amplifier may fail to provide an output that properly controls the power FET, and the sense FET may be damaged. For example, the sense transistor may be damaged if servo-amplifier settles in a state wherein the gate-source voltage of the sense transistor is higher than the gate oxide breakdown voltage of the sense transistor.

Implementations of the servo-amplifier disclosed herein include closed-loop biasing that prevents saturation of the input transistors of the servo-amplifier due to fast power supply rise. The servo-amplifier disclosed herein maintains proper operation of the servo-loop and prevents damage to the sense FET.

Figure 1:
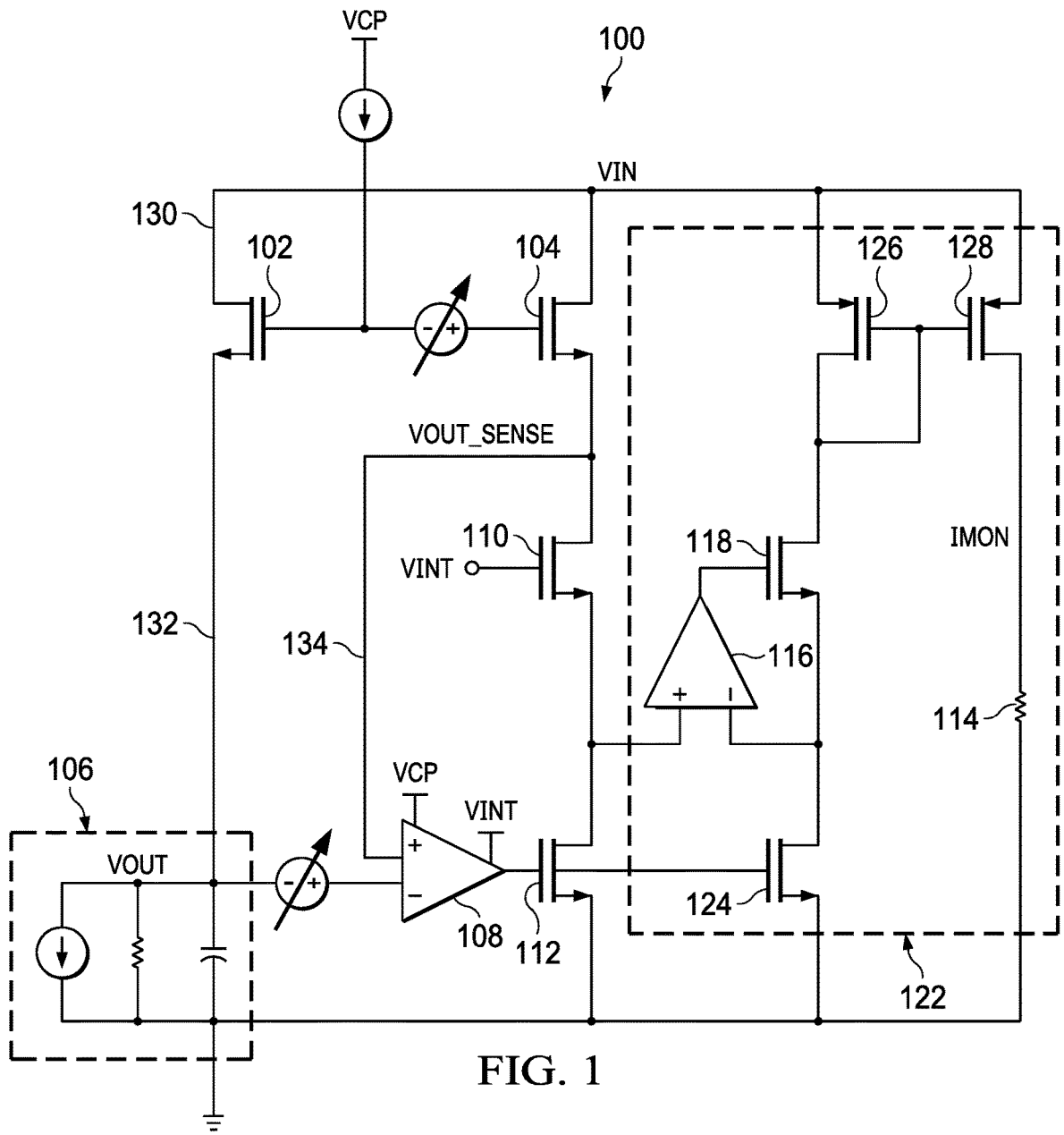
FIG. 1 shows a schematic diagram of an example electronic fuse circuit that includes a current sense circuit in accordance with the present disclosure.

FIG. 1 shows a schematic diagram of an example electronic fuse circuit 100 in accordance with the present disclosure. The electronic fuse circuit 100 includes a power transistor 102, a sense transistor 104, and a servo amplifier 108. Some implementations of the electronic fuse circuit 100 include monitoring circuitry 122. The power transistor 102 and sense transistor 104 may be positive channel (P-channel) metal oxide semiconductor field effect transistors (MOSFETs) in some implementations of the electronic fuse circuit 100. In the electronic fuse circuit 100, the resistance of the power transistor 102 may be controlled based on the current flowing in the power transistor 102, the voltage across the power transistor 102, and/or other parameters, such that if the current flowing in the power transistor 102 exceeds a predetermined threshold, then the resistance of the power transistor 102 is increased to decrease current flow.

The power transistor 102 is coupled to a voltage input terminal 130 and a voltage output terminal 132, and conducts current from the voltage input terminal 130 to the voltage output terminal 132 and to a load circuit 106. The load circuit 106 is not part of the electronic fuse circuit 100, but is shown in FIG. 1 to provide context. The load circuit 106 may include various active and/or passive components that are powered by the electronic fuse circuit 100.

The sense transistor 104 is coupled to the voltage input terminal 130 and a sense output terminal 134, and conducts current from the voltage input terminal 130 to the sense output terminal 134. The sense transistor 104 is a scaled-down version of the power transistor 102. For example, the sense transistor 104 may be scaled to conduct a current that is a small fraction (e.g., 1/8000th) of the current conducted by the power transistor 102 where a same control voltage is provided at the gates of the power transistor 102 and the sense transistor 104. The output of the sense transistor 104 can be used to measure the current flowing in the power transistor 102.

The servo amplifier 108 is coupled to the output of the power transistor 102 and to the output of the sense transistor 104. A negative input of the servo amplifier 108 is coupled the source terminal of the power transistor 102, and a positive input of the servo amplifier 108 is coupled to the source terminal of the sense transistor 104. The servo amplifier 108 equalizes the gate-source voltage of the power transistor 102 and the sense transistor 104 based on the outputs of the power transistor 102 and the sense transistor 104. The servo amplifier 108 controls the current flowing in the sense transistor 104, the transistor 110, and the transistor 112 to equalize the gate-source and drain-source voltage of the power transistor 102 and the sense transistor 104 and provide a sense current that is a precisely scaled version of the current flowing in the power transistor 102 at the source terminal of the sense transistor 104. General characteristics of the servo amplifier 108 include high bandwidth to be used as a current sensor/current feedback for outer loops, high DC gain to reduce gain error, and low offset voltage to improve accuracy.

Some implementations of the electronic fuse circuit 100 also include the monitoring circuitry 122. The monitoring circuitry 122 mirrors the current flowing in the sense transistor 104 to produce a voltage signal that is representative of the current flowing in the power transistor 102. The monitoring circuitry 122 includes an operational amplifier 116, a transistor 124, a transistor 118, a transistor 126, a transistor 128, and a resistor 114. The inputs of the operational amplifier 116 are coupled to the transistor 112 and the transistor 124. The operational amplifier 116 maintains the drain to source of the transistor 124 equal to that of the transistor 112 by controlling the transistor 118. The transistor 124 carries a scaled current of that of the transistor 112. The transistor 124 and the transistor 118 control the current flowing in the transistor 126, and the current flowing in the transistor 126 is mirrored in the transistor 128. The current flowing in the transistor 128 also flows through the resistor 114, so that the voltage across the resistor 114 is representative of the current flowing in the transistor 128 (and representative of the currents flowing in the sense transistor 104 and the power transistor 102).

Figure 2:
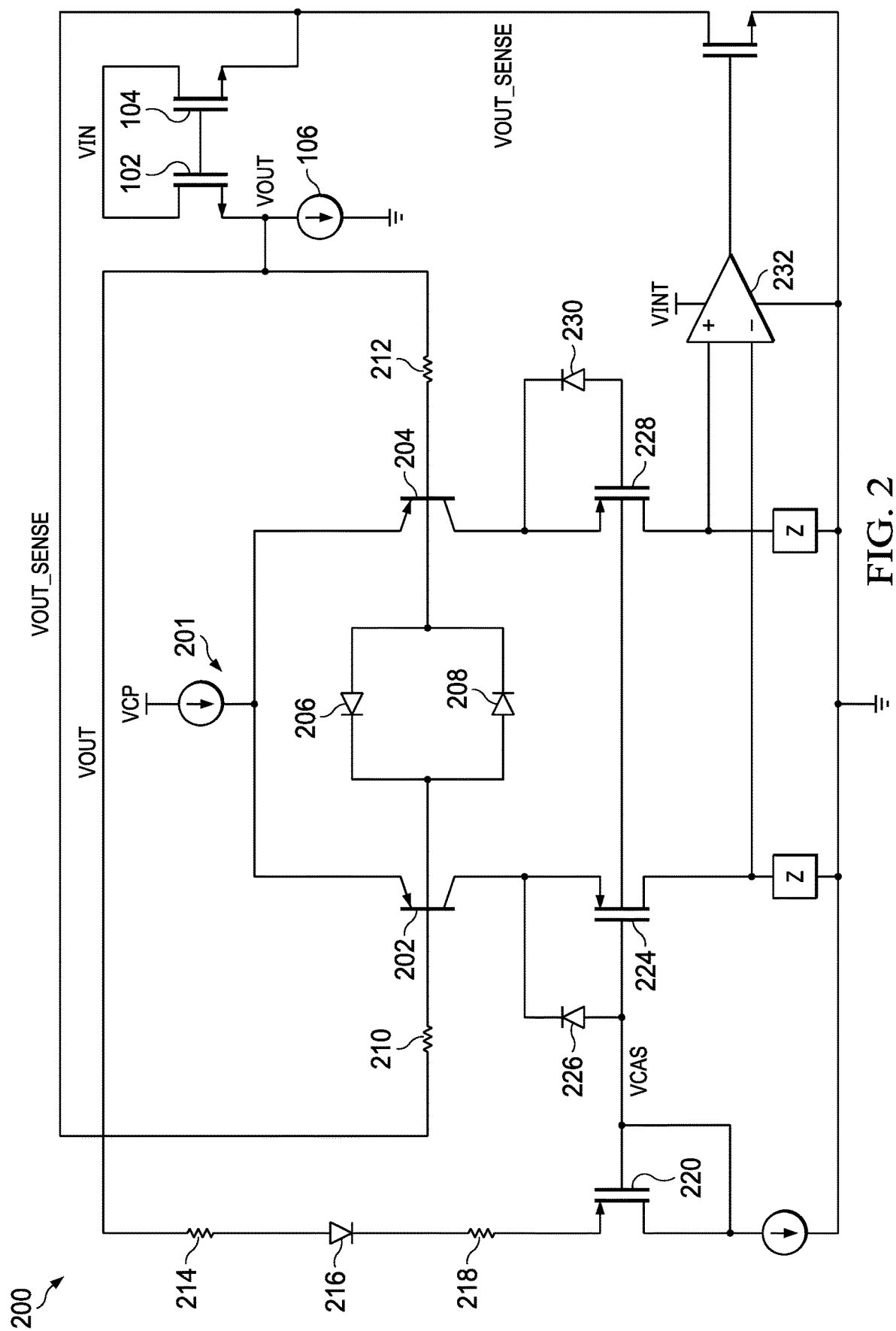
FIG. 2 shows a schematic diagram of an example servo-amplifier that includes constant voltage biasing.

FIG. 2 shows a schematic diagram of an example servo-amplifier 200 that includes constant voltage biasing. The servo-amplifier 200 may be deployed as an implementation of the servo-amplifier 108. The power transistor 102 and the sense transistor 104, while not part of the servo-amplifier 200, are shown in FIG. 2 to facilitate explanation. The servo-amplifier 200 includes an input stage 201 and one or more successive stages 232 coupled to the input stage 201. The input stage 201 includes a transistor 202, a transistor 204, a transistor 220 a transistor 224 and a transistor 228. To reduce offset voltage, the transistor 202 and the transistor 204 may be bipolar junction transistors. The transistor 202 and the transistor 204 are connected to form a differential amplifier. The emitter of the transistor 202 is connected to the emitter of the transistor 204. The base of the transistor 204 is coupled to the output of the power transistor 102 by the resistor 212. The base of the transistor 202 is coupled to the output of the sense transistor 104 by the resistor 210. The resistor 210 and the resistor 212 provide protection from electrostatic discharge and latch-up. The base of the transistor 202 is connected to the base of the transistor 204 by diode 206 and diode 208 to protect the transistor 202 and the transistor 204 from high differential voltage at the outputs of the power transistor 102 and sense transistor 104. An anode of the diode 206 is connected to the base of the transistor 204, and a cathode of the diode 206 is connected to the base of the transistor 202, so that the diode 206 conducts current from the base of the transistor 204 to the base of the transistor 202. An anode of the diode 208 is connected to the base of the transistor 202, and cathode of the diode 208 is connected to the base of the transistor 204, so that the diode 208 conducts current from the base of the transistor 202 to the base of the transistor 204.

The transistor 224 and the transistor 228 are cascode transistors, and are respectively connected to the transistor 202 and the transistor 204. The transistor 224 and the transistor 228 may be positive-channel (P-channel) MOSFETs in some implementations of the servo-amplifier 200. A source of the transistor 224 is connected to a collector of the transistor 202, and a source of the transistor 228 is connected to a collector of the transistor 204. A diode 226 connects a gate of the transistor 224 to the source of the transistor 224. An anode of the diode 226 is connected to the gate of the transistor 224, and a cathode of the diode 226 is connected to the source of the transistor 224. A diode 230 connects a gate of the transistor 228 to the source of the transistor 228. An anode of the diode 230 is connected to the gate of the transistor 228, and a cathode of the diode 230 is connected to the source of the transistor 228. The diode 226 and the diode 230 protect the transistor 224 and the transistor 228 from transient high voltage across gate-source during hotplug.

The transistor 224 and the transistor 228 are biased by the transistor 220. The transistor 220 is connected as a diode. The transistor 220 may be a P-channel MOSFET in some implementations of the servo-amplifier 200. The source of the transistor 220 is coupled to the source of the power transistor 102 via the resistor 214, the diode 216, and the resistor 218. In some implementations of the servo-amplifier 200, the source of the transistor 220 is coupled to a dedicated bias voltage circuit via the resistor 218.

The source of the power transistor 102 may be connected to a terminal of the electronic fuse circuit 100 to provide power to circuits external to the electronic fuse circuit 100 (i.e., the load 106). When the source of the power transistor 102 rises quickly, as when the electronic fuse circuit 100 is hot-plugged into a system causing a high voltage to suddenly appear at the source of the power transistor 102, or when a power source connected to the drain of the power transistor 102 causes voltage to rise quickly, the servo-amplifier 200 may settle in a stable, but undesirable, operating condition in which the input stage 201 produces no differential output and potentially results in damage to the sense transistor 104 and inability to properly measure the current in power transistor 102.

Figure 3:
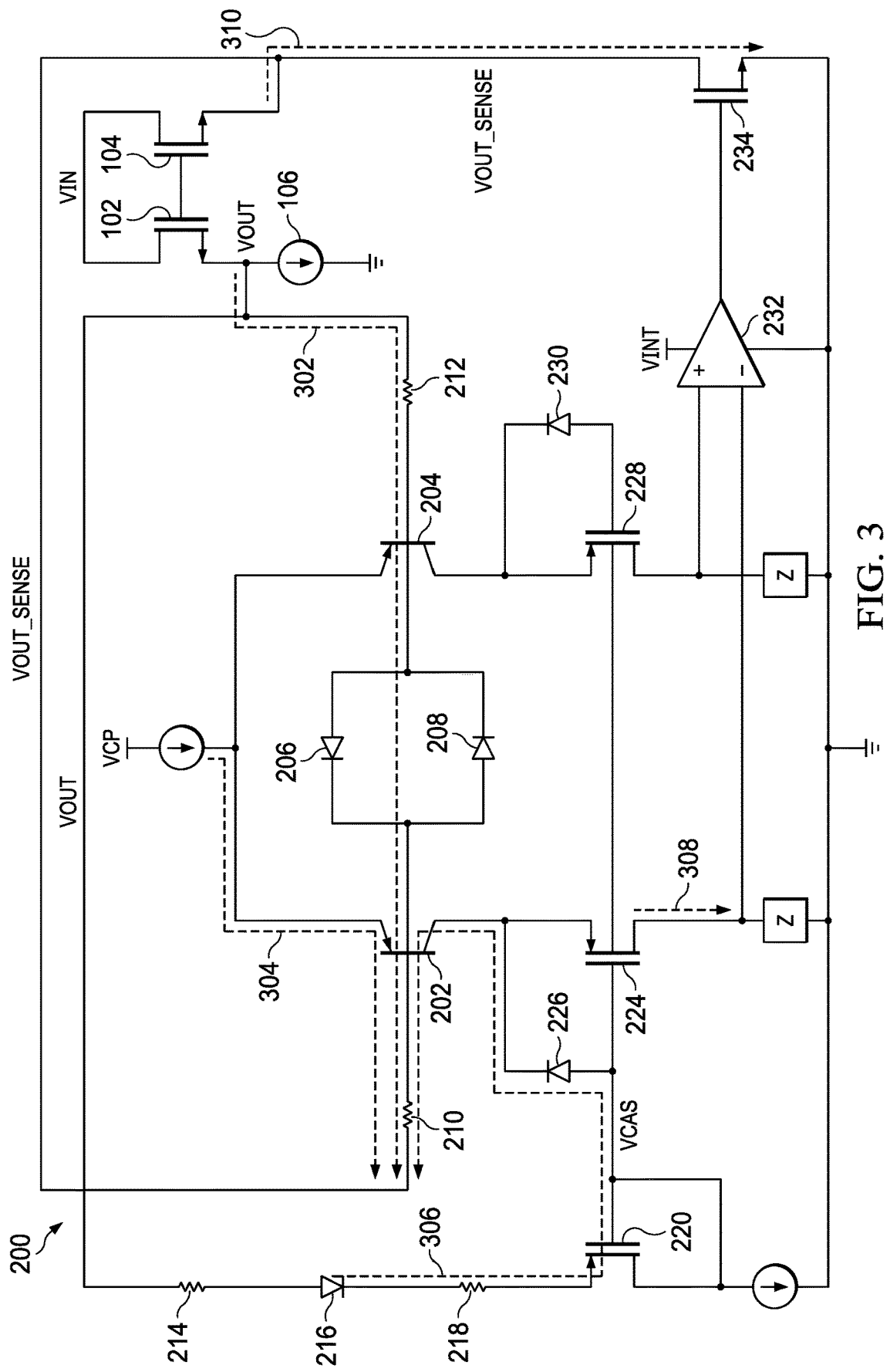
FIG. 3 shows an example of transient currents in the servo-amplifier of FIG. 2, for an output hotplug event in the electronic fuse circuit of FIG. 1.

FIG. 3 shows the servo-amplifier 200 and the various currents flowing therein when the voltage at the source of the power transistor 102 rises rapidly. Initially, the voltage at the source of the sense transistor 104 is zero. When the voltage at the source of the power transistor 102 rises very quickly, a large transient current 302 flows from the source of the power transistor 102 through the resistor 212, through the diode 206, and through the resistor 210 to the source of the sense transistor 104. There is a large voltage drop across the resistor 210 and the resistor 212. The voltage at the source of the power transistor 102 is much greater than the voltage at the base of the transistor 202. The transistor 224 is not properly biased, and the voltage at the source of the transistor 224 is voltage at the gate on the transistor 224 less the voltage dropped by the diode 226.

If the transistor 224 were properly biased, the voltage at the source of the transistor 224 would be the voltage at the gate of the transistor 224 plus the source to gate voltage required for the transistor 224 to conduct the bias current. The collector-base junction of the transistor 202 is forward biased (i.e., the transistor 202 is in saturation) because the base is at much lower voltage than DC bias point and the collector is biased at the expected DC bias point. Bias current 304 at the emitter of the transistor 202 flows out of the base of the transistor 202 and through the resistor 210 due to very low current gain (p) in saturated transistor 202. No bias current 308 flows from the source to the drain of the transistor 224, and consequently, no differential signal is presented at the inputs of the successive stages 232. A large current 306 flows from the source of the power transistor 102 through the resistor 214, the diode 216, the resistor 218, the transistor 220, the diode 226, the collector to base junction of transistor 202, and resistor 210. The current 308 in transistor 224 goes to zero or a very low value as the bias current flows out of the base of the transistor 202. In the absence of any signal or bias current from the differential pair (transistors 202 and 204), there is no differential input information across the two inputs of amplifier 232. So, the output of amplifier 232 can settle at any voltage in between its supply rails, based on the internal bias design of the amplifier 232.

Based on the uncontrolled output of the amplifier 232, the output from the source of the sense transistor 104 settles to a potential where the current 304, the current 306, and the sense transistor drain to source current 310 for the given gate to source voltage adds up and creates total drain to source current of the transistor 234 such that the current sustains for the gate voltage applied, i.e. sustains the output of the amplifier 232 such that:

$$(V_{OUT} - V_{OUT\_SENSE}) = (V_{IN} - V_{OUT\_SENSE}) \neq 0$$

In other words, due to lack of differential signal at the input of the amplifier 232, the output of the amplifier 232 settles at an unwanted voltage, based on its internal bias condition. That voltage, i.e. the gate to source voltage of the transistor 234, determines the drain to source current of the transistor 234, i.e. the sinking current at node VOUT_SENSE. The sourcing current at VOUT_SENSE is the sum of current 304, current 306 and current 310, all of which are a function of VOUT_SENSE. So, the current 304 and the current 306 settle at a value where the sourcing current and sinking current at node VOUT_SENSE becomes equal and it is a stable operating point. In this condition, the current 304 is not equal to zero and also current 306 is not equal to zero. So, the stable operating point established is an unwanted one, i.e., the amplifier in closed negative feedback loop is not operating in linear region with both the inputs as equal. Moreover, under such conditions the gate-source voltage of the sense transistor 104 may be very high (e.g., higher than the gate oxide breakdown voltage of the sense transistor 104) and damage the sense transistor 104.

Figure 4:
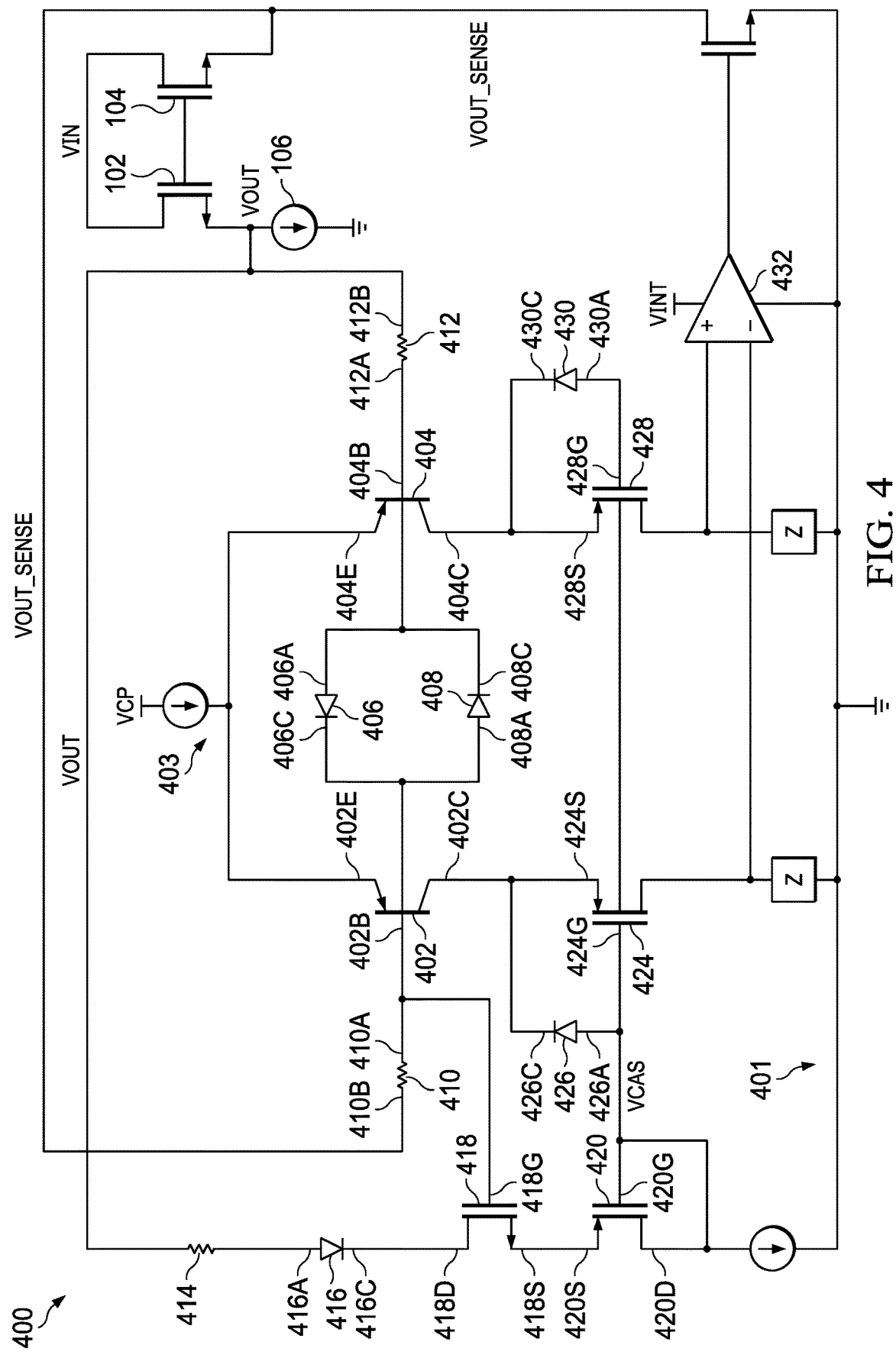
FIG. 4 shows a schematic diagram of an example servo-amplifier that includes differential input based closed loop cascode biasing.

FIG. 4 shows a schematic diagram of an example servo-amplifier 400 that includes differential input based closed loop cascode biasing. The closed loop biasing of the servo-amplifier 400 prevents the undesirable operational state exhibited by the servo-amplifier 200 when a high ramp rate e.g., a hotplug condition is suddenly presented on the power output of the power transistor 102, which is the reference input of the servo-amplifier 400. The servo-amplifier 400 may be deployed as an implementation of the servo-amplifier 108. The power transistor 102 and the sense transistor 104, while not part of the servo-amplifier 400, are shown in FIG. 4 to facilitate explanation. The servo-amplifier 400 includes an input stage 401 and one or more successive stages 432 coupled to the input stage 401. The input stage 401 includes a transistor 402, a transistor 404, a transistor 418, a transistor 420, a transistor 424, and a transistor 428. To reduce offset voltage, the transistor 402 and the transistor 404 may be bipolar junction transistors. The transistor 402 and the transistor 404 are connected to form a differential amplifier 403. The emitter terminal 402E of the transistor 402 is connected to the emitter terminal 404E of the transistor 404. The base terminal 404B of the transistor 404 is coupled to the output (i.e., the source terminal) of the power transistor 102 by the resistor 412. That is, a first terminal 412A of the resistor 412 is connected to the base terminal 404B of the transistor 404, and a second terminal 412B of the resistor 412 is connected to the source terminal of the power transistor 102. The base terminal 402B of the transistor 402 is coupled to the output of the sense transistor 104 by the resistor 410. That is, a first terminal 410A of the resistor 410 is connected to the base terminal 402B of the transistor 402, and a second terminal 410B of the resistor 410 is connected to the source terminal of the sense transistor 104. The resistor 410 and the resistor 412 provide protection from electrostatic discharge and latch-up as one or both the inputs are connected to external pins.

The base of the transistor 402 is connected to the base of the transistor 404 by diode 406 and diode 408. The diode 406 and the diode 408 are protection diodes that protect the transistor 402 and the transistor 404 from high differential voltage at the inputs of the transistors 402 and 404, where the transistors 402 and 404 may be low voltage rated bipolar junction transistors. An anode 406A of the diode 406 is connected to the base terminal 404B of the transistor 404 and a cathode 406C of the diode 406 is connected to the base terminal 402B of the transistor 402, so that the diode 406 conducts current from the base terminal 404B of the transistor 404 to the base terminal 402B of the transistor 402. An anode 408A of the diode 408 is connected to the base terminal 402B of the transistor 402 and a cathode 408C of the diode 408 is connected to the base terminal 404B of the transistor 404, so that the diode 408 conducts current from the base terminal 402B of the transistor 402 to the base terminal 404B of the transistor 404.

The transistor 424 and the transistor 228 are cascode transistors, and are respectively connected to the transistor 402 and the transistor 404. The transistor 424 and the transistor 428 may be positive-channel (P-channel) MOSFETs in some implementations of the servo-amplifier 400. A source terminal 424S of the transistor 424 is connected to a collector terminal 402C of the transistor 402, and a source terminal 428S of the transistor 428 is connected to a collector terminal 404C of the transistor 404. A diode 426 connects a gate of the transistor 424 to the source of the transistor 424. An anode 426A of the diode 426 is connected to the gate terminal 424G of the transistor 424, and a cathode 426C of the diode 426 is connected to the source terminal 424S of the transistor 424. A diode 430 connects a gate terminal 428G of the transistor 428 to the source terminal 428S of the transistor 428. An anode 430A of the diode 430 is connected to the gate terminal 428G of the transistor 428, and a cathode 430C of the diode 430 is connected to the source terminal 428S of the transistor 428. The diode 426 and the diode 430 protect the transistor 424 and the transistor 428 from transients.

The transistor 424 and the transistor 428 are biased by the transistor 420. The transistor 420 is connected as a diode, and compensates for the source to gate voltage drop of the transistor 424 and makes the collector voltage of the transistor 402 approximately equal to the bias voltage provided at the source of the transistor 418. A drain terminal 420D of the transistor 420 is connected to a gate terminal 420G of the transistor 420. The transistor 420 may be a P-channel MOSFET in some implementations of the servo-amplifier 400. The source terminal 420S of the transistor 420 is coupled to the source of the power transistor 102 via the resistor 414, the diode 416, and the transistor 418. The drain terminal 420D of the transistor 420 is connected to the gate terminal 424G of the transistor 424 and to the gate terminal 428G of the transistor 428. The source terminal 420S of the transistor 420 is connected to the source terminal 418S of the transistor 418.

The transistor 418 is a bias transistor and may be an N-channel MOSFET in some implementations of the servo-amplifier 400. The drain terminal 418D of the transistor 418 is coupled to the power transistor 102, and to the base terminal 404B of the transistor 404. The drain terminal 418D of the transistor 418 is connected to the cathode 416C of the diode 416, the source terminal 418S of the transistor 418 is connected to the source terminal 420S of the transistor 420, and the gate terminal 418G of the transistor 418 is coupled to the base terminal 402B of the transistor 402 and to the sense transistor 104. That anode 416A of the diode 416 is connected to the resistor 414. The transistor 418 is chosen or designed such that gate-source voltage of the transistor 418 is greater than the forward voltage drop of the diode 426. The transistor 418 controls the bias voltage provided to the transistor 424 based on the difference of the voltage at the source of the power transistor 102 and the voltage at the source of the sense transistor 104. As a result, in the presence of a transient, the transistor 418 provides closed-loop biasing that reduces the bias voltage provided to the transistor 424, prevents saturation of the transistor 402, and maintains operation of the servo-amplifier 400 and the servo-loop in which the servo-amplifier 400 operates. When no transient is present (e.g., a transient passes), the transistor 418 operates in the linear region and provides open-loop constant biasing to the transistor 424. Thus, when the source of the power transistor 102 rises quickly, as when the electronic fuse circuit 100 is hot-plugged into a system causing a high ramp rate voltage to appear at the source of the power transistor 102, or when a power source connected to the drain of the power transistor 102 causes voltage to rise quickly, the transistor 418 prevents the servo-amplifier 400 from settling in an undesirable operating condition, and prevents damage to the sense transistor 104. In DC condition, the circuit operates in open loop biasing, similar to the servo-amplifier 200, and thus design complications of closed loop negative feedback biasing techniques are not involved.

Figure 5:
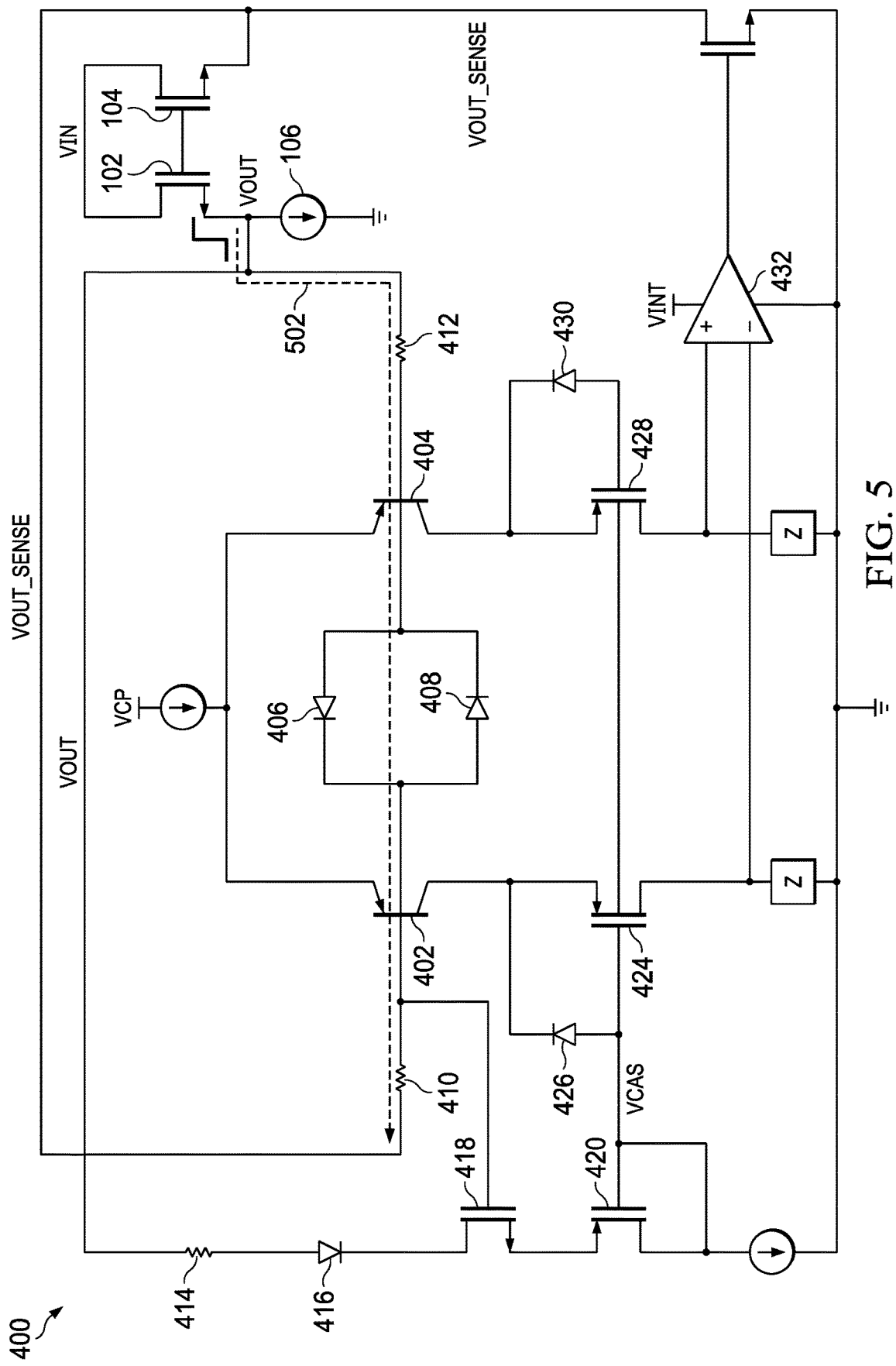
FIG. 5 shows an example of transient currents in the servo-amplifier of FIG. 4, for an output hotplug event in the electronic fuse circuit of FIG. 1.

FIG. 5 shows the servo-amplifier 400 and the various currents flowing therein when the voltage at the source of the power transistor 102 rises rapidly. Initially, the voltage at the source of the sense transistor 104 is zero. When the voltage at the source of the power transistor 102 rises very quickly, a large transient current 502 flows from the source of the power transistor 102 through the resistor 412, through the diode 406, and through the resistor 410 to the source of the sense transistor 104. There is a large voltage drop across the resistor 410 and the resistor 412. The voltage at the source of the power transistor 102 is much greater than the voltage at the base of the transistor 402. The gate of the transistor 418 is connected to the base of the transistor 402, causing the transistor 418 to control the bias voltage provided to the transistor 424 based on the difference of the voltages at the sources of the power transistor 102 and the sense transistor 104. As a result, the base-collector voltage of the transistor 402 is approximately equal to the gate-source voltage of the transistor 418, the transistor 402 does not go into saturation, the servo-amplifier 400 remains in regulation, and the servo-loop remains intact. When the transient disappears (i.e., in steady-state operation), the transistor 418 provides constant biasing to the transistor 424. Thus, the servo-amplifier 400 avoids the undesirable transient operation to which the servo-amplifier 200 is subject.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic fuse circuit, comprising:
   a power transistor configured to conduct a load current to a load circuit;
   a sense transistor coupled to the power transistor, the sense transistor configured to conduct a sensed current that is a predetermined fraction of the load current conducted by the power transistor;
   a servo-amplifier coupled to the power transistor and the sense transistor, the servo-amplifier comprising:
      a bipolar transistor comprising a first terminal coupled to the sense transistor;
      a cascode transistor comprising a first terminal coupled to a second terminal of the bipolar transistor; and
      a bias transistor comprising:
         a first terminal coupled to the power transistor;
         a second terminal coupled to the first terminal of the bipolar transistor; and
         a third terminal coupled to a second terminal of the cascode transistor;
         wherein the bias transistor is configured to control a bias voltage provided to the cascode transistor based on a difference in voltage output of the power transistor and voltage output of the sense transistor.

2. The electronic fuse circuit of claim 1, further comprising:
   a diode-connected transistor coupled to a third terminal of the bias transistor; and
   a diode configured to conduct current from a terminal of the diode-connected transistor to the bipolar transistor.

3. The electronic fuse circuit of claim 2, wherein a gate-to-source voltage of the bias transistor is greater than a voltage dropped by the diode.

4. The electronic fuse circuit of claim 2 wherein the cascode transistor is coupled to the diode-connected transistor.

5. The electronic fuse circuit of claim 4, wherein the bipolar transistor is a first bipolar transistor, and the servo-amplifier further comprises as second bipolar transistor coupled to the first bipolar transistor to form a differential pair.

6. The electronic fuse circuit of claim 5, further comprising:
   a first diode for conducting current from a base of the first bipolar transistor to a base of the second bipolar transistor; and
   a second diode for conducting current from a base of the second bipolar transistor to a base of the first bipolar transistor.

7. The electronic fuse circuit of claim 5, wherein the cascode transistor is a first cascode transistor, and the servo-amplifier further comprises a second cascode transistor coupled to the second bipolar transistor and the diode-connected transistor.

8. The electronic fuse circuit of claim 1, further comprising:
   a voltage input terminal coupled to the power transistor and the sense transistor;
   a voltage output terminal coupled to the power transistor; and
   a sense output terminal coupled to the sense transistor.

9. A servo-amplifier, comprising:
   a differential amplifier, comprising:
      a first transistor; and
      a second transistor, comprising a first terminal connected to a first terminal of the first transistor;
   a third transistor comprising:
      a first terminal coupled to a second terminal of the second transistor; and
      a second terminal connected to a second terminal of the first transistor;
   a first diode comprising:
      a cathode connected to the second terminal of the first transistor; and
      an anode directly connected to the second terminal of the second transistor; and
   a second diode comprising:
      a cathode directly connected to the second terminal of the second transistor; and
      an anode connected to the second terminal of the first transistor.

10. A servo-amplifier, comprising:
    a differential amplifier, comprising:
       a first transistor; and
       a second transistor, comprising a first terminal connected to a first terminal of the first transistor;
    a third transistor comprising:
       a first terminal coupled to a second terminal of the second transistor; and
       a second terminal connected to a second terminal of the first transistor; and
    a fourth transistor comprising:
       a first terminal;
       a second terminal connected to the first terminal; and
       a third terminal directly connected to a third terminal of the third transistor.

11. The servo-amplifier of claim 10, further comprising:
    a fifth transistor comprising:
       a first terminal connected to the first terminal of the fourth transistor; and
       a second terminal connected to a third terminal of the first transistor; and
    a diode comprising:
       a cathode connected to the second terminal of the fifth transistor; and
       an anode connected to the first terminal of the fifth transistor.

12. The servo-amplifier of claim 10, further comprising:
    a fifth transistor comprising:
       a first terminal connected to the first terminal of the fourth transistor; and
       a second terminal connected to a third terminal of the second transistor; and
    a diode comprising:
       a cathode connected to the second terminal of the fifth transistor; and an anode connected to the first terminal of the fifth transistor.

13. A servo-amplifier, comprising:
a differential amplifier, comprising:
   a first transistor; and
   a second transistor, comprising a first terminal connected to a first terminal of the first transistor;
a third transistor comprising:
   a first terminal coupled to a second terminal of the second transistor; and
   a second terminal connected to a second terminal of the first transistor; and
a diode comprising:
   a cathode coupled to the first terminal of the third transistor; and
   an anode coupled to the second terminal of the second transistor;
a first resistor comprising a terminal connected to the second terminal of the first transistor; and
a second resistor comprising:
   a first terminal connected to the second terminal of the second transistor; and
   a second terminal coupled to an anode of the diode.

14. A servo-amplifier, comprising:
a first bipolar transistor;
a second bipolar transistor comprising an emitter terminal connected to an emitter terminal of the first bipolar transistor to form a differential amplifier;
a cascode transistor comprising a source terminal connected to a collector terminal of the first bipolar transistor;
a bias transistor coupled to the first bipolar transistor, the second bipolar transistor and the cascode transistor, the bias transistor configured to generate a bias voltage to drive a gate terminal of the cascode transistor based on a voltage at a base terminal of the first bipolar transistor and a voltage at a base terminal of the second bipolar transistor; and
a diode-connected transistor having a first terminal connected to a second terminal and a third terminal connected to the bias transistor.

15. The servo-amplifier of claim 14, wherein the cascode transistor is a first cascode transistor, and the servo-amplifier further comprises a second cascode transistor comprising:
   a source terminal connected to a collector terminal of the second bipolar transistor; and
   a gate terminal coupled to the bias transistor.

16. The servo-amplifier of claim 14, further comprising a diode that connects a gate terminal and the source terminal of the cascode transistor; wherein a gate-source voltage of the bias transistor is greater than a voltage drop across the diode.

17. The servo-amplifier of claim 14, further comprising protection diodes that connect the base terminal of the first bipolar transistor to the base terminal of the second bipolar transistor.

18. The servo-amplifier of claim 14, further comprising a transistor connected as a diode configured to compensate for the source to gate voltage drop of the cascode transistor and make the collector voltage of first bipolar transistor equal to bias transistor source voltage.

* * * * *